US011195764B2

(12) United States Patent
Lee et al.

(10) Patent No.: US 11,195,764 B2
(45) Date of Patent: Dec. 7, 2021

(54) VERTICAL TRANSPORT FIELD-EFFECT TRANSISTORS HAVING GERMANIUM CHANNEL SURFACES

(71) Applicant: INTERNATIONAL BUSINESS MACHINES CORPORATION, Armonk, NY (US)

(72) Inventors: Choonghyun Lee, Rensselaer, NY (US); Pouya Hashemi, White Plains, NY (US); Takashi Ando, Tuckahoe, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 41 days.

(21) Appl. No.: 15/945,121

(22) Filed: Apr. 4, 2018

(65) Prior Publication Data

US 2019/0311958 A1    Oct. 10, 2019

(51) Int. Cl.
*H01L 21/82* (2006.01)
*H01L 21/8238* (2006.01)
(Continued)

(52) U.S. Cl.
CPC .. *H01L 21/823885* (2013.01); *H01L 21/0262* (2013.01); *H01L 21/02532* (2013.01); *H01L 21/02609* (2013.01); *H01L 21/225* (2013.01); *H01L 21/324* (2013.01); *H01L 21/823807* (2013.01); *H01L 27/092* (2013.01); *H01L 29/04* (2013.01); *H01L 29/1054* (2013.01); *H01L 29/165* (2013.01); *H01L 29/66666* (2013.01); *H01L 29/7827* (2013.01)

(58) Field of Classification Search
CPC .............................................. H01L 21/823885
USPC ......................................................... 257/190
See application file for complete search history.

(56) References Cited

U.S. PATENT DOCUMENTS 7,446,025 B2   11/2008  Cohen et al.
9,496,263 B1 * 11/2016  Ando ................. H01L 27/0922
(Continued)

OTHER PUBLICATIONS

C.H. Lee et al., "Thermally Robust CMOS-aware Ge MOSFETs with High Mobility at High-carrier Densities on a Single Orientation Ge Substrate" IEEE 2014 Symposium on VLSI Technology Digest of Technical Papers (Sep. 11, 2014) pp. 1-2.
(Continued)

*Primary Examiner* — Thao X Le
*Assistant Examiner* — Laura M Dykes
(74) *Attorney, Agent, or Firm* — Tutunjian & Bitetto, P.C.; Erik Johnson

(57) ABSTRACT

A method for fabricating a semiconductor device including vertical transport fin field-effect transistors (VTFETs) is provided. The method includes forming a bottom spacer on a first device region associated with a first VTFET and a second device region associated with a second VTFET, forming a liner on the bottom spacer, on a first fin structure including silicon germanium (SiGe) formed in the first device region and on a second fin structure including SiGe formed in the second device region, and forming crystalline Ge having a hexagonal structure from the SiGe by employing a Ge condensation process to orient a (111) direction of the crystalline Ge in a direction of charge flow for a VTFET.

20 Claims, 13 Drawing Sheets

(51) Int. Cl.
*H01L 21/02* (2006.01)
*H01L 21/225* (2006.01)
*H01L 29/78* (2006.01)
*H01L 29/66* (2006.01)
*H01L 27/092* (2006.01)
*H01L 29/10* (2006.01)
*H01L 29/165* (2006.01)
*H01L 29/04* (2006.01)
*H01L 21/324* (2006.01)

(56) References Cited

U.S. PATENT DOCUMENTS

| | | | |
|---|---|---|---|
| 9,601,626 | B2 | 3/2017 | Lee et al. |
| 9,673,322 | B2 | 6/2017 | Xiao |
| 9,761,661 | B2 | 9/2017 | Ando et al. |
| 9,799,765 | B1 | 10/2017 | Bergendahl et al. |
| 2003/0227072 | A1* | 12/2003 | Forbes ............ H01L 21/823885 257/616 |
| 2004/0161886 | A1* | 8/2004 | Forbes ............. H01L 29/78648 438/198 |
| 2007/0241399 | A1* | 10/2007 | Irisawa ............... H01L 29/7853 257/347 |
| 2009/0236595 | A1 | 9/2009 | Atanackovic |
| 2011/0147847 | A1* | 6/2011 | Cea .................... H01L 21/76224 257/368 |
| 2011/0303985 | A1* | 12/2011 | Masuoka ................ H01L 21/84 257/369 |
| 2014/0170839 | A1* | 6/2014 | Brunco ............... H01L 29/1054 438/479 |
| 2014/0357060 | A1* | 12/2014 | Liu ........................ H01L 21/845 438/479 |
| 2014/0374834 | A1 | 12/2014 | Luo et al. |
| 2015/0295040 | A1* | 10/2015 | Tsai ................. H01L 21/823807 257/371 |
| 2016/0071956 | A1* | 3/2016 | Balakrishnan .... H01L 29/66818 257/401 |
| 2016/0240616 | A1* | 8/2016 | Cea .................... H01L 29/66431 |
| 2016/0343605 | A1 | 11/2016 | Kelly et al. |
| 2017/0288056 | A1 | 10/2017 | Balakrishnan et al. |

OTHER PUBLICATIONS

P. Hashemi, et al., "High-Mobility High-Ge-Content Si1-xGex-OI PMOS FinFETs with Fins Formed Using 3D Germanium Condensation with Ge Fraction up to x~ 0.7, Scaled EOT~8.5Å and ~10nm Fin Width" IEEE 2015 Symposium on VLSI Technology Digest of Technical Papers (Sep. 3, 2015) pp. T16-T17.

Disclosed Anonymously, "Method of Forming High Ge% CMOS" An IP.com Prior Art Database Technical Disclosure IP.com No. IPCOM000237116D (Jun. 3, 2014) pp. 1-13.

Disclosed Anonymously, "Complementary Metal-oxide Semiconductor (CMOS) Fin-shaped Field Effect Transistor (FinFET) with High Germanium (Ge) Content and Method for Fabricating the CMOS FinFET" An IP.com Prior Art Database Technical Disclosure IP.com No. IPCOM000238188D (Aug. 7, 2014) pp. 1-6.

Disclosed Anonymously, "A Method for Fabricating Silicon-Germanium on Insulator Substrates" An IP.com Prior Art Database Technical Disclosure IP.com No. IPCOM000244936D (Feb. 2, 2016) pp. 1-5.

* cited by examiner

VERTICAL TRANSPORT FIELD-EFFECT TRANSISTORS HAVING GERMANIUM CHANNEL SURFACES

BACKGROUND

Technical Field

The present invention generally relates to semiconductor devices, and more particularly to vertical transport field-effect transistors (VTFETs) and methods of fabricating the same.

Description of the Related Art

One type of fin field effect transistor (FinFET) is a vertical transport FinFET (VTFET). In a lateral or horizontal FinFET, the source and drain regions are positioned such that current runs horizontally between the source/drain regions. However, in a VTFET, the source and drain regions are positioned such that the current runs vertically between the source/drain regions.

SUMMARY

In accordance an embodiment of the present invention, a method for fabricating a semiconductor device including vertical transport fin field-effect transistors (VTFETs) is provided. The method includes forming a bottom spacer on a first device region associated with a first VTFET and a second device region associated with a second VTFET, forming a liner on the bottom spacer, on a first fin structure including silicon germanium (SiGe) formed in the first device region and on a second fin structure including SiGe formed in the second device region, and forming crystalline Ge having a hexagonal structure from the SiGe by employing a Ge condensation process to orient a (111) direction of the crystalline Ge in a direction of charge flow for a VTFET.

In accordance with another embodiment of the present invention, a method for fabricating a semiconductor device including vertical transport fin field-effect transistors (VTFETs) is provided. The method includes forming a first fin structure including silicon germanium (SiGe) on in a first device region associated with a first VTFET and a second fin structure including SiGe on in a second device region associated with a second VTFET, forming a first sidewall spacer layer on the first fin structure and a second sidewall spacer layer on the second fin structure, forming a first bottom source/drain region within the first device region and a second bottom source/drain region within the second device region, performing an anneal process to diffuse dopants of the first and second bottom source/drain regions, forming a bottom spacer on the first device region and the second device region, forming a liner on the bottom spacer and the first and second fin structures, and forming crystalline Ge having a hexagonal structure from the SiGe by employing a Ge condensation process to orient a (111) direction of the crystalline Ge in a direction of charge flow for a VTFET.

In accordance with yet another embodiment of the present invention a semiconductor device including vertical transport fin field-effect transistors (VTFETs) is provided. The device includes a substrate, a first VTFET formed on the substrate in a first region, and a second VTFET formed on the substrate in a second region. The first VTFET includes a first bottom source/drain region and a first fin structure, and the second VTFET includes a second bottom source/ drain region and a second fin structure. The first and second fin structures include crystalline Ge having a hexagonal structure and current is configured to flow vertically along a (111) orientation of the crystalline Ge.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
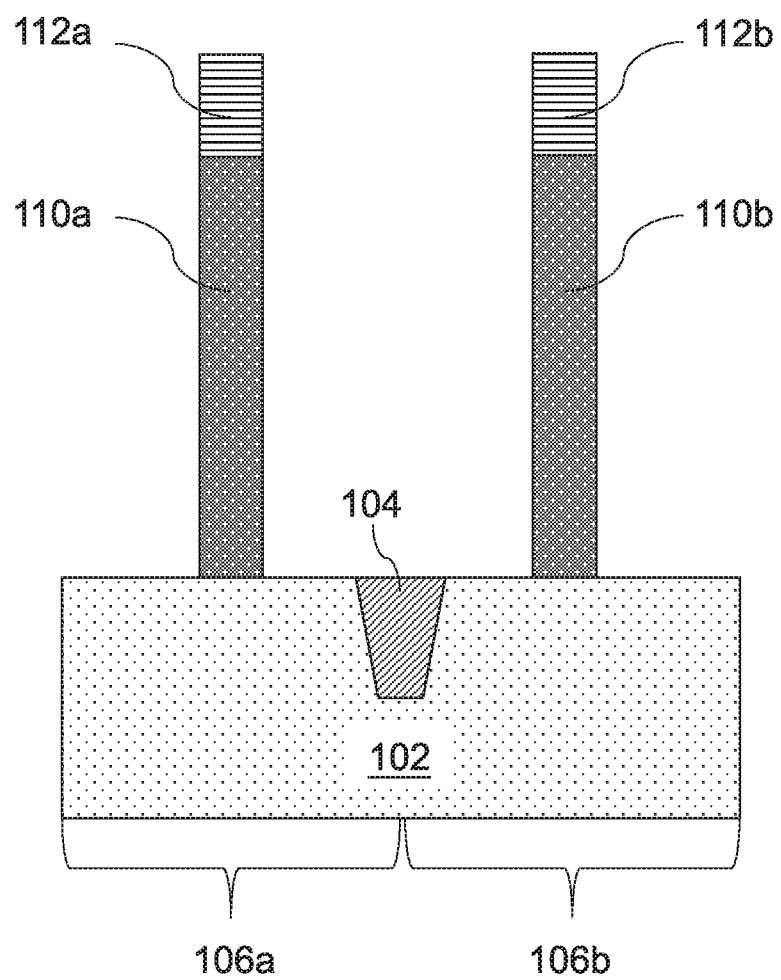
FIG. 1 is a cross-sectional view of fin structures formed on a substrate having first and second device regions during the fabrication of a semiconductor device, in accordance with an embodiment of the present invention.

High carrier mobility channel materials, including germanium (Ge) or III-V semiconductor materials, can provide benefits over channel surfaces formed from materials such as silicon (Si). Of these high carrier mobility channel materials, (111)-orientated Ge, or Ge (111), has one of the lowest interface state densities (Dit) across the bandgap, as well as both high electron and hole mobility.

For example, typical $D_{it}$ values for Ge (111) range from about 8e10 $eV^{-1}$ $cm^{-2}$ to about 2e11 $eV^{-1}$ $cm^{-2}$ near the mid-gap, which is comparable to a Si (111) surface, while other surface orientations of Ge (e.g., Ge (100) and Ge (110)) may have a $D_{it}$ that is 2 to 3 times higher than Ge (111). For III-V semiconductor materials, $D_{it}$ is generally much higher than Si or Ge, regardless of surface orientation. One example of a III-V semiconductor material is InGaAs, which has a $D_{it}$ that ranges from about 5e11 $eV^{-1}$ $cm^{-2}$ to about 5e12 $eV^{-1}$ $cm^{-2}$ near the mid-gap. That is, the $D_{it}$ of InGaAs is about 10 times higher than that of Ge (111).

Higher $D_{it}$ values correspond to reduced device performance. Thus, due to the properties of Ge (111) as compared to other Ge or III-V semiconductor materials, semiconductor devices having channel surfaces including Ge (111) are particularly attractive for high performance applications since they can provide improvements to both electron and hole mobility and electrostatic gate control.

The embodiments described herein provide for the fabrication of a vertical complementary-metal-oxide semiconductor (CMOS) device, such as a vertical transport fin field-effect transistor (VTFET), having channel surfaces including crystalline Ge formed on regions of the CMOS device (e.g, an n-type FET (nFET) region and a p-type FET (pFET) region). For example, in an illustrative embodiment, a fin structure including silicon germanium (SiGe) can be epitaxially grown on a substrate including Si, such (110)-orientated Si or Si (110). After a Ge condensation process is performed, crystalline Ge having a hexagonal structure (e.g., a hexagonal prism structure) is formed on the Si substrate, which can provide a Ge (111) channel orientation in the vertical direction. In one embodiment, the Ge condensation process includes a three-dimensional (3D) Ge condensation process.

It will be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material will take on the orientation of the surface it is formed on. In some embodiments, epitaxial growth and/or deposition processes are selective to forming on semiconductor surface, and generally do not deposit material on exposed surfaces, such as silicon dioxide or silicon nitride surfaces.

Referring now to the drawings in which like numerals represent the same or similar elements, FIGS. 1-11 depict respective steps of a process flow for fabrication of a vertical CMOS device having Ge channel surfaces formed on regions of the CMOS device. In one embodiment, and as shown, the vertical CMOS device is a VTFET.

Referring to FIG. 1, a cross-sectional view showing an exemplary semiconductor device 100 is provided. As shown, the device 100 includes a substrate 102. The substrate 102 can include any suitable substrate structure, e.g., a bulk semiconductor, a semiconductor-on-insulator (SOI) substrate, etc. In one example, at least one of the substrate 102 can include a silicon-containing material. Illustrative examples of Si-containing materials suitable for the substrate can include, but are not limited to, Si, SiGe, SiGeC, SiC and multi-layers thereof. In one embodiment, the substrate 102 includes Si (110). Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The device 100 further includes at least one shallow trench isolation (STI) region 104 that provides isolation between device regions 106a and 106b. The STI region 104 is formed by etching a trench in the substrate utilizing an etch process, such as reactive-ion etching (RIE) or plasma etching, although such examples should not be considered limiting. The trench can optionally be lined with a liner material, e.g., an oxide, and then CVD or another like deposition process is used to fill the trench with polysilicon or another like STI dielectric material. The STI dielectric material can optionally be densified after deposition. A planarization process such as chemical-mechanical polishing (CMP) can be used to provide a planar structure.

A fin structure 110a is formed in the region 106a, and a fin structure 110b is formed in the region 106b. The fin structures 110a and 110b can be formed by epitaxially growing a semiconductor material film that includes germanium within the regions 106a and 106b, and forming the fin structures 110a and 110b from the epitaxially grown semiconductor material film. For example, an etch process can be employed to remove a portion of the epitaxially grown semiconductor material film to create the fin structures 110a and 110b. For example, a reactive-ion etch (RIE) process can be employed to remove the epitaxially grown semiconductor material film.

In one embodiment, the semiconductor material that includes Ge includes SiGe. As mentioned above, SiGe is a semiconductor material that includes $Si_xGe_{1-x}$ where x is less than or equal to 1. That is, SiGe is an alloy with a molar ratio of Si and Ge.

The epitaxial growth process of the SiGe film can be done at the very beginning of device fabrication process utilizing any process suitable for use in accordance with the embodiments described herein, such as by blanket epitaxial growth of the SiGe film. In the embodiment where the substrate 102 includes Si, an atomic lattice mismatch between the SiGe film and the Si is introduced. Thus, to avoid crystalline defect generation during the fabrication of the device 100, the SiGe film should have a sufficiently low atomic percentage of Ge relative to the atomic percentage of Si (e.g., a low Ge content SiGe). Otherwise, crystalline defects can be formed in the SiGe film, which can limit the performance of the device 100, as well as yield additional issues associated with the device 100.

The initial atomic percentage of Ge included in the SiGe film can be determined in accordance with the epitaxial growth process. For example, the SiGe film can have an initial atomic percentage of Ge less or equal to about 40% (e.g., SiGe 40%), such that the initial atomic percentage of Si included in the SiGe film is greater than or equal to about 60%. In one embodiment, the initial atomic percentage of Ge in the SiGe film is less than or equal to about 25% (e.g., SiGe 25%), such that the initial atomic percentage of Si included in the SiGe film is greater than or equal to about 75%. In one embodiment, the initial atomic percentage of Ge in the SiGe film is less than or equal to about 20% (e.g., SiGe 20%), such that the initial atomic percentage of Si included in the SiGe film is greater than or equal to about 80%. The initial atomic percentage of Ge included in the SiGe film can be tightly controlled below 0.5% during the epitaxial process.

As further shown, a cap layer 112a is formed on the fin structure 110a and a cap layer 112b is formed on the fin structure 110b. The cap layers 112a and 112b can include a dielectric material, such as a nitride, oxide, oxynitride material, and/or any other suitable dielectric material. The cap layers 112a and 112b can include a single layer of dielectric material or multiple layers of dielectric materials. The cap layers 112a and 112b can be formed by a deposition process, such as chemical vapor deposition and/or atomic layer deposition. Alternatively, the cap layers 112a and 112b can be formed using a growth process, such as thermal oxidation or thermal nitridation.

Figure 2:
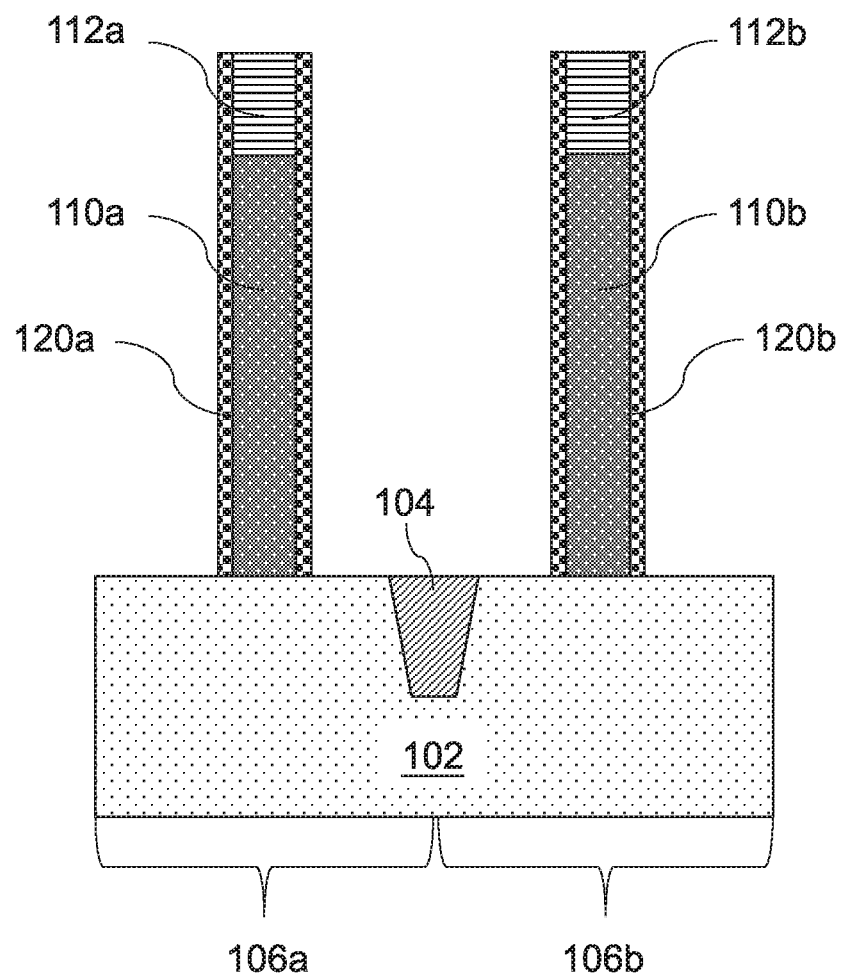
FIG. 2 is a cross-sectional view of spacer layers formed on the fin structures during the fabrication of the semiconductor device, in accordance with an embodiment of the present invention.

Referring to FIG. 2, a sidewall spacer layer 120a is formed on the fin structure 110a and the cap layer 112a, and a sidewall spacer layer 120b is formed on the fin structure 110b and the cap layer 112b. The sidewall spacer layers 120a and 120b can be formed by conformally depositing spacer layer material, and performing an etch process (e.g., RIE) to remove the excess spacer material. The spacer material of the sidewall spacer layers 120a and 120b can include any suitable dielectric material in accordance with the embodiments described herein, such as silicon oxide, silicon nitride, boron nitride, silicon carbon, etc. In one embodiment, the sidewall spacer layers 120a and 120b include a low-k dielectric material. The term "low-k dielectric" generally refers to a dielectric material having a dielectric constant less than silicon dioxide ($SiO_2$) (e.g., less than 3.9). Examples of low-k dielectric materials include, but are not limited to, dielectric nitrides (e.g., silicon nitride, SiBCN) and dielectric oxynitrides (e.g., SiOCN).

Figure 3:
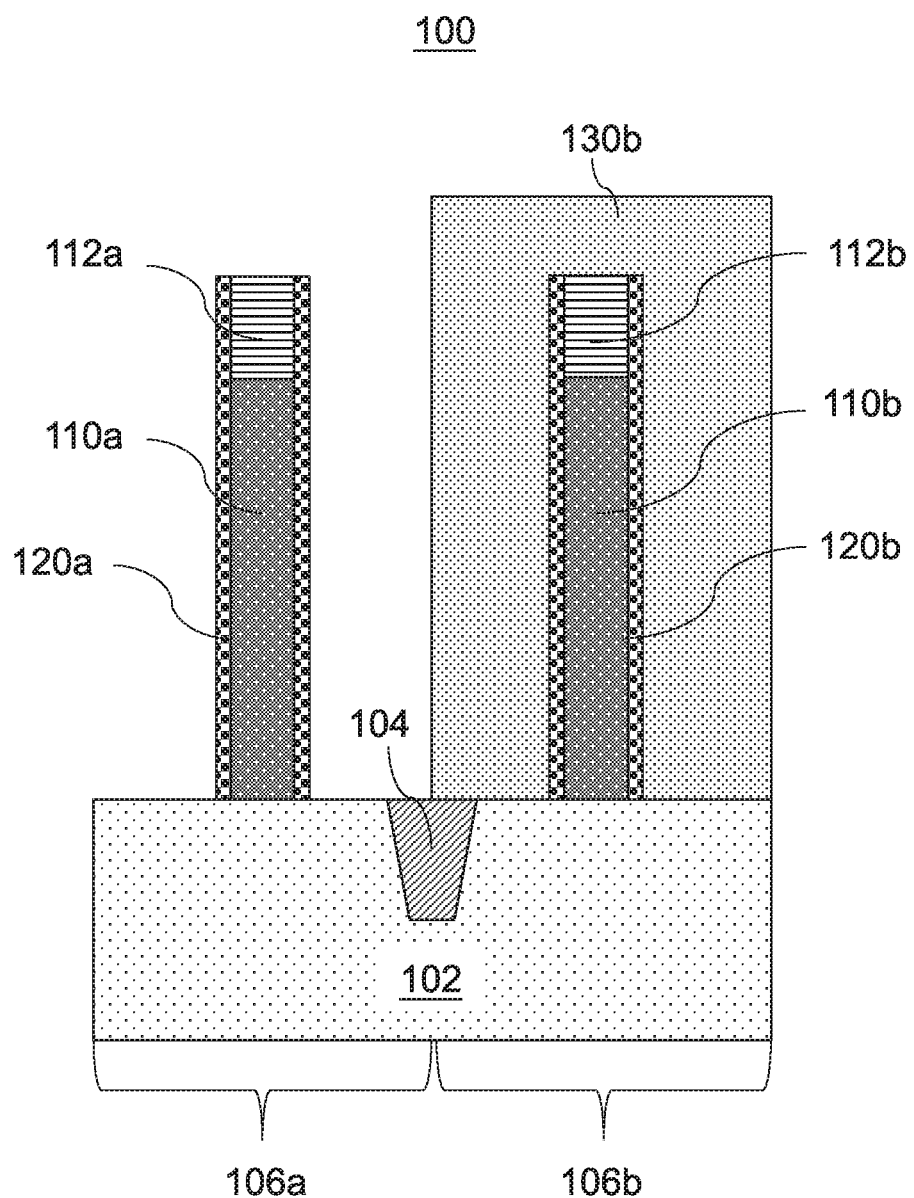
FIG. 3 is a cross-sectional view of a mask formed in the second device region during the fabrication of the semiconductor device, in accordance with an embodiment of the present invention.

Referring to FIG. 3, a block mask 130b is formed overlying the device region 106b. The block mask 130b may include soft and/or hard mask materials formed using any processes suitable for use in accordance with the embodiments described herein. In one embodiment, the block mask 130b includes any suitable dielectric material that has an etch selectivity over the cap layers 112a and 112b, and the sidewall spacer layers 120a and 120b, in accordance with the embodiments described herein.

Figure 4:
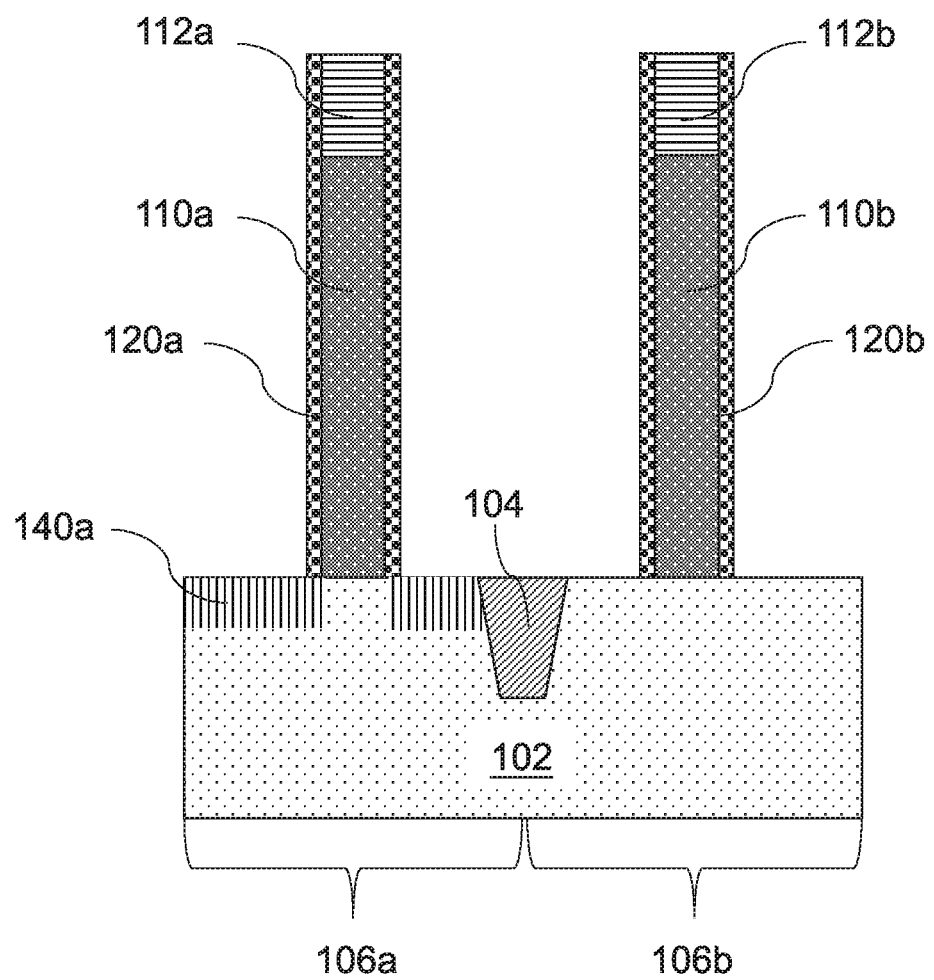
FIG. 4 is a cross-sectional view a bottom source/drain region formed in the first device region and the removal of the mask formed in the second device region during the fabrication of the semiconductor device, in accordance with an embodiment of the present invention.

Referring to FIG. 4, bottom source/drain region 140a is formed in the device region 106a while the device region 106b is being protected by the block mask 130b. The formation of the bottom source/drain region 140a can be performed, for example, via epitaxial growth and/or ion implantation to provide for a first type of semiconductor device. In one embodiment, the first type of semiconductor device is an n-type semiconductor device. Thereafter, the block mask 130b is removed using any suitable removal process.

Figure 5:
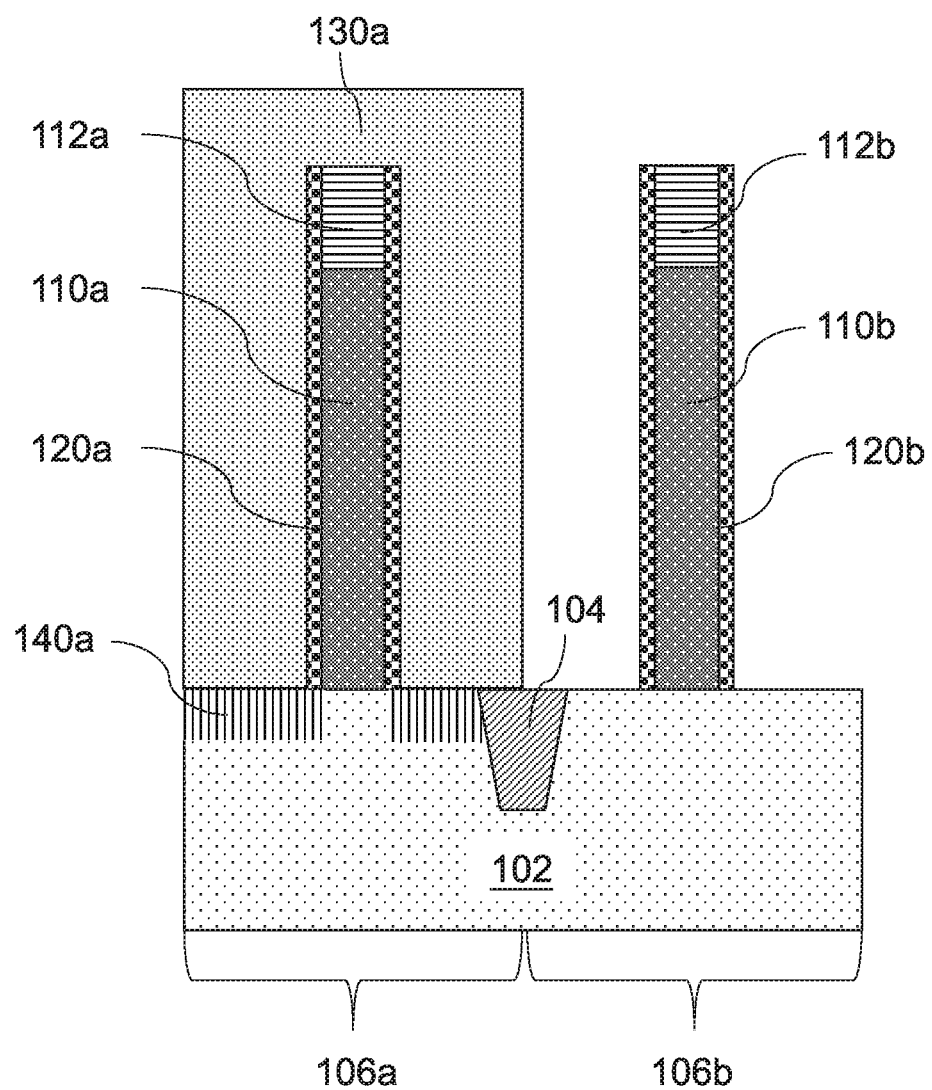
FIG. 5 is a cross-sectional view of a mask formed in the first device region during the fabrication of the semiconductor device, in accordance with an embodiment of the present invention.

Referring to FIG. 5, a block mask 130a is formed overlying the device region 106b. Similar to the block mask 130b, the block mask 130a may include soft and/or hard mask materials formed using any processes suitable for use in accordance with the embodiments described herein. In one embodiment, the block mask 130a includes any suitable dielectric material that has an etch selectivity over the cap layers 112a and 112b, and the sidewall spacer layers 120a and 120b, in accordance with the embodiments described herein.

Figure 6:
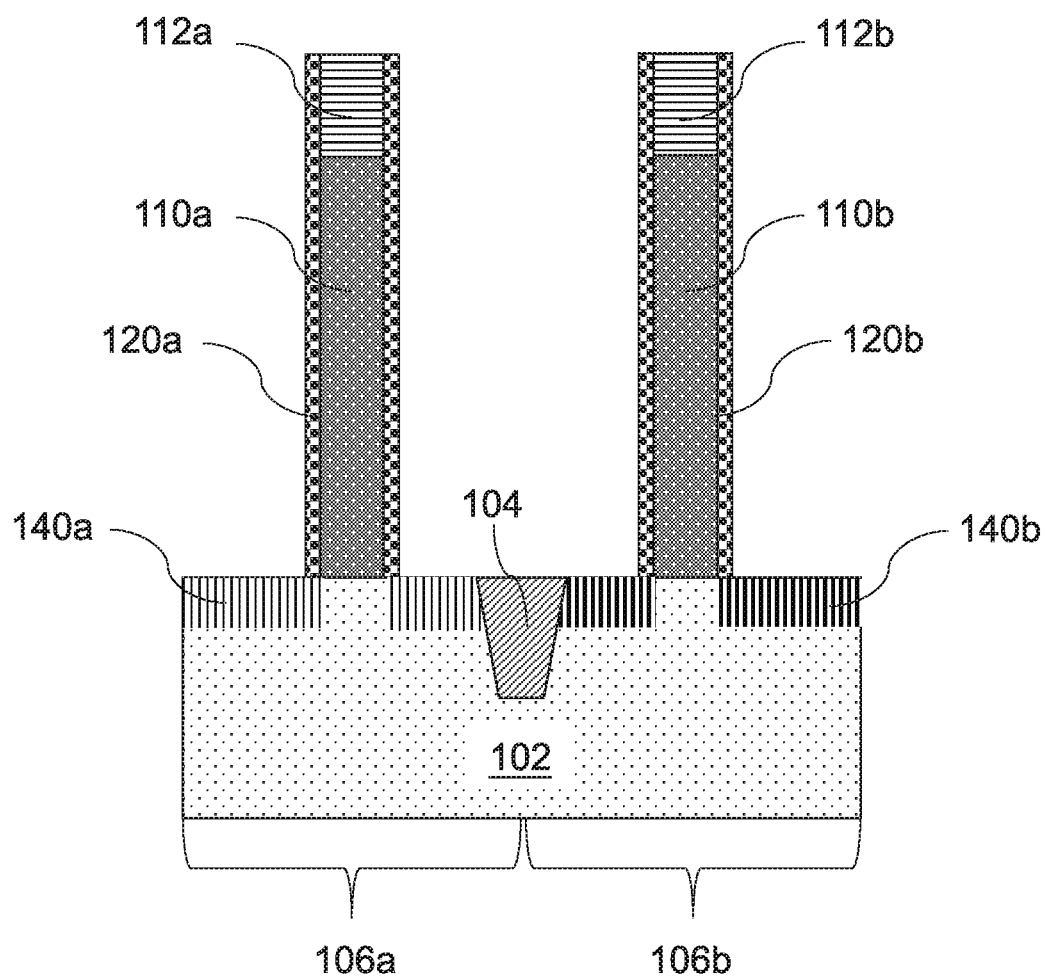
FIG. 6 is a cross-sectional view of a bottom source/drain region formed in the second device region and the removal of the mask formed in the first device region during the fabrication of the semiconductor device, in accordance with an embodiment of the present invention.

Referring to FIG. 6, a bottom source/drain region 140b is formed in the device region 106b while the device region 106a is protected by the block mask 130a. The formation of the bottom source/drain region 140b can be performed, for example, via epitaxial growth and/or ion implantation to provide for a second type of semiconductor device having a different doping from the first type. In one embodiment, the second type of semiconductor device is a p-type semiconductor device. Thereafter, the block mask 130a is removed using any suitable removal process.

Figure 7:
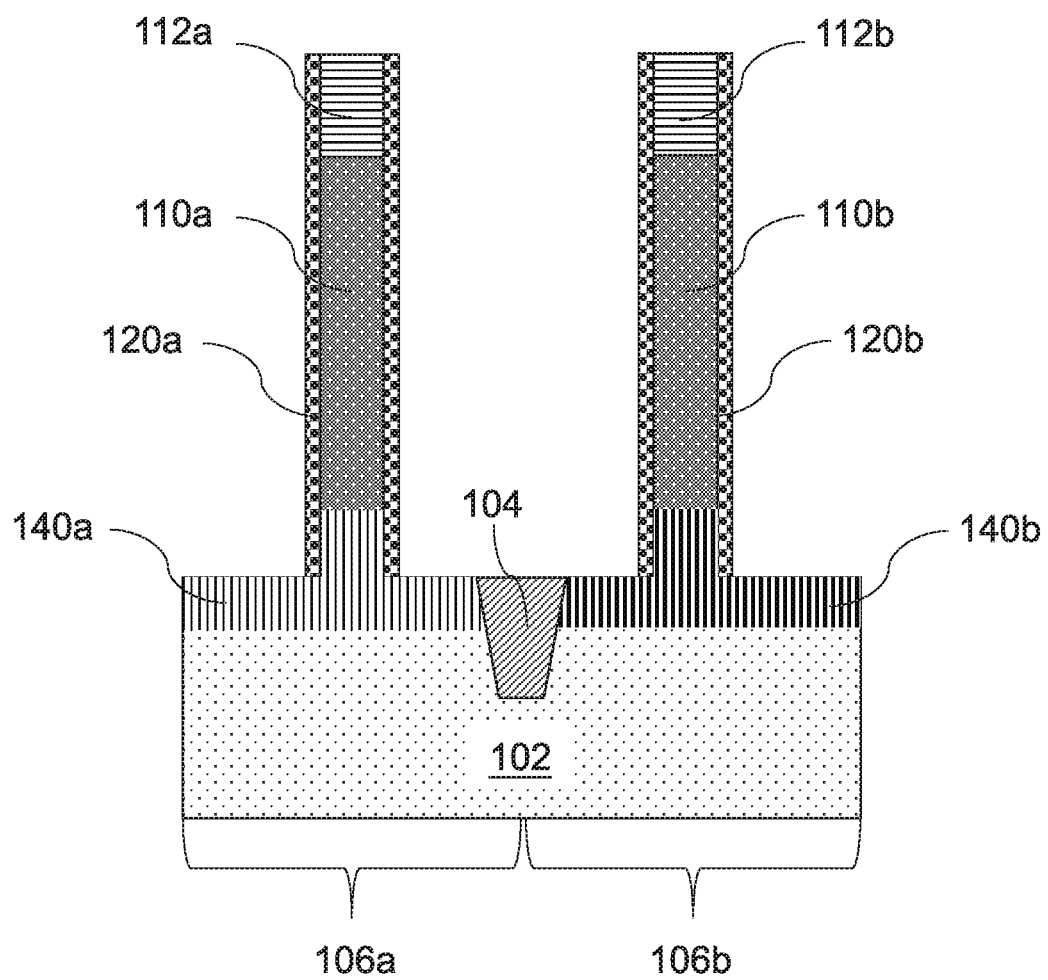
FIG. 7 is a cross-sectional view of junction anneal for dopant diffusion performed during the fabrication of the semiconductor device, in accordance with an embodiment of the present invention.

Referring to FIG. 7, an anneal process is performed to diffuse dopants of the bottom source/drain regions 140a and 140b. In one embodiment, the anneal process includes a junction anneal process. Any anneal process to diffuse the dopants of the bottom source/drain regions 140a and 140b can be employed in accordance with the embodiments described herein.

Figure 8:
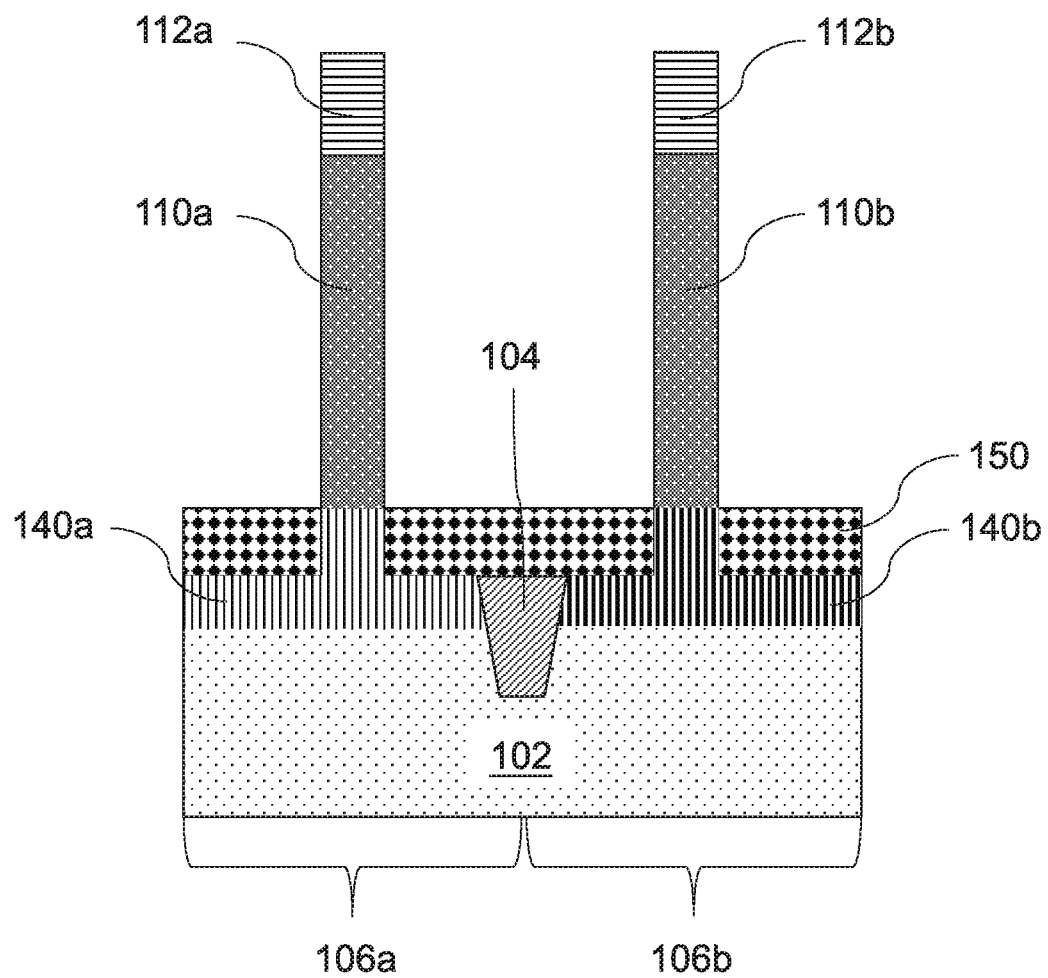
FIG. 8 is a cross-sectional view of the removal of the spacer layers and the formation of a bottom spacer layer during the fabrication of the semiconductor device, in accordance with an embodiment of the present invention.

Referring to FIG. 8, a bottom spacer layer 150 is formed on the device 100 in device regions 106a and 106b between the fin structures 110a and 110b. The bottom spacer layer 150 can be formed by any suitable process (e.g., plasma vapor deposition), and can include any suitable dielectric material in accordance with the embodiments described herein. For example, the bottom spacer layer 150 can include $SiO_2$. In one embodiment, the bottom spacer layer 150 includes a low-k dielectric material. Examples of low-k dielectric materials include, but are not limited to, dielectric nitrides (e.g., silicon nitride, SiBCN) and dielectric oxynitrides (e.g., SiOCN).

After the bottom spacer 150 layer is formed, channel surfaces including crystalline Ge are formed from the semiconductor material of the fin structures 110a and 110b (e.g., SiGe) via one or more cycles of a Ge condensation process. In one embodiment, the one or more cycles of the Ge condensation process include one or more cycles of a three-dimensional (3D) Ge condensation process. Multiple cycles of Ge condensation process can be performed in order to achieve a sufficiently high concentration of crystalline Ge. For example, multiple cycles of Ge condensation process can be performed in order to achieve a crystalline Ge concentration of around 100%.

Further details regarding a given cycle of the Ge condensation process will be described herein below with reference to FIGS. 9 and 10.

Figure 9:
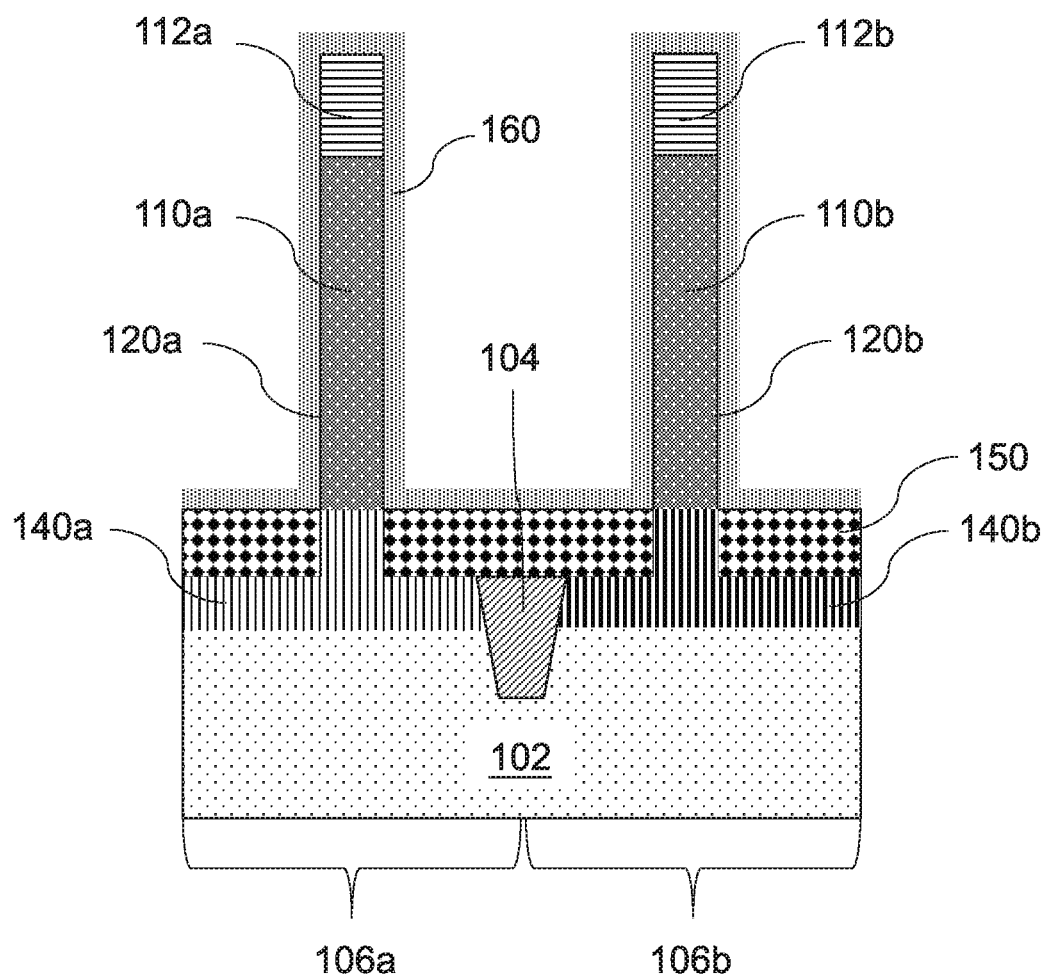
FIG. 9 is a cross-sectional view of a liner formed during the fabrication of the semiconductor device, in accordance with an embodiment of the present invention.

Referring to FIG. 9, a liner 160 is formed in the device regions 106a and 106b (e.g., on the bottom spacer 150 and the fin structures 110a and 110b). In one embodiment, and as shown, the liner 160 is conformally deposited. The liner 160 functions to protect the fin structures 110a and 110b during the Ge condensation process and to prevent diffusion of the Ge from the fin structures 110a and 110b. The liner 160 can include any suitable material in accordance with the embodiments described herein. For example, in one embodiment, the liner 160 can include $SiO_2$.

Figure 10:
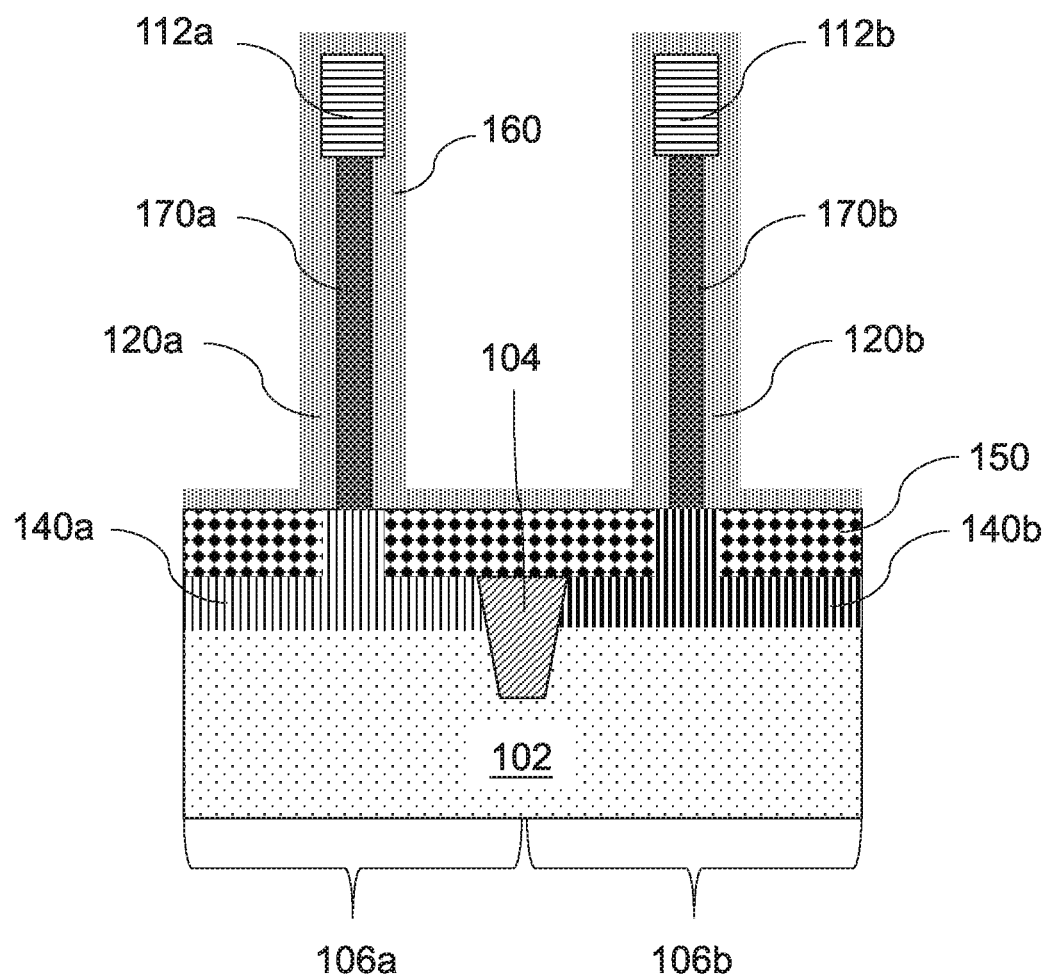
FIG. 10 is a cross-sectional view of pure Ge produced during the fabrication of the semiconductor device, in accordance with an embodiment of the present invention.

Referring to FIG. 10, channel surfaces including crystalline Ge are formed from the semiconductor material of the fin structures 110a and 110b (e.g., SiGe) via a Ge condensation process, resulting in fin structures 170a and 170b, respectively. For example, the Ge condensation process can include a 3D Ge condensation process. The 3D Ge condensation process can be induced by thermal oxidation. For example, the 3D Ge condensation process can be induced in an oxygen gas ($O_2$) environment from about 600 degrees Celsius to about 800 degrees Celsius.

As described above, multiple cycles of the Ge condensation process described in FIGS. 9-10 can be performed in order to achieve a sufficient high concentration of crystalline Ge. To that end, if a sufficiently high concentration of the crystalline Ge is not achieved after the Ge condensation process illustrated in FIG. 10, the liner 160 is removed (it is thicker than the initial thickness after the Ge condensation is performed), another liner is formed on the device 100, and a subsequent cycle of the Ge condensation process is performed. In one embodiment, due to the increase in the percentage of Ge after the performance of the preceding cycle of the Ge condensation process, the temperature associated with the subsequent cycle of the Ge condensation process is less than the temperature associated with the preceding cycle of the Ge condensation process.

The iterative process of removing the liner 160 and performing additional cycles of the Ge condensation process should be repeated until the desired concentration of crystalline Ge is achieved.

The crystalline Ge formed via the cycle(s) of the Ge condensation process has a hexagonal structure (e.g., a hexagonal prism structure), including surface along which current is configured to flow in a VTFET (e.g., along a (111) surface of the crystalline Ge). Further details regarding the hexagonal structure of the crystalline Ge will now described in further detail below with reference to FIG. 11.

Figure 11:
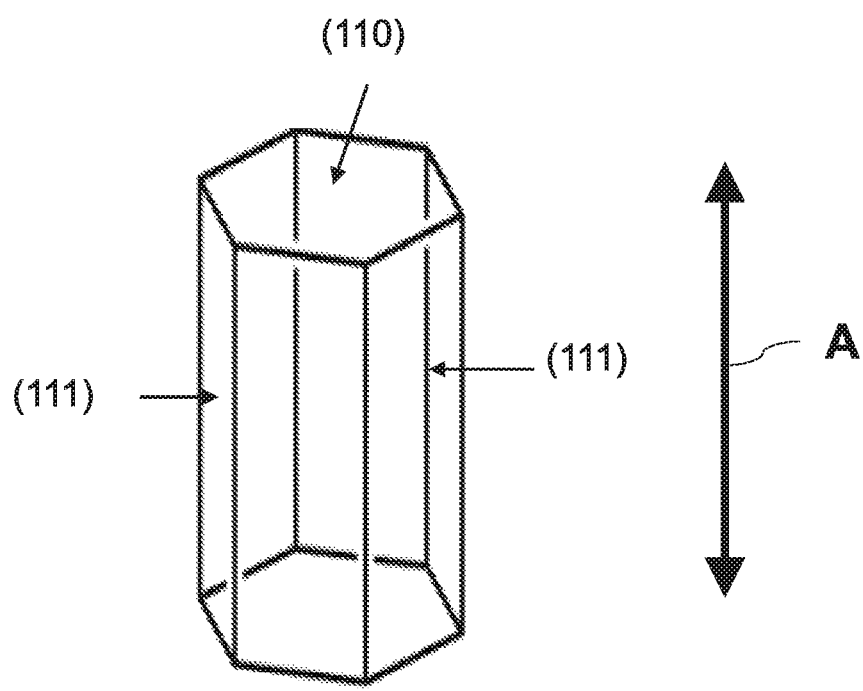
FIG. 11 is a diagram illustrating the geometry of the pure Ge produced in FIG. 10, in accordance with an embodiment of the present invention.

Referring to FIG. 11, a crystalline structure 200, which can represent the crystalline Ge formed in the process described with reference to FIG. 10, is shown. The crystalline structure 200 is a hexagonal structure (e.g., a hexagonal prism structure). The crystalline structure 200 has crystal surfaces including a (110) surface and a (111) surface. The (111) surface of the crystalline structure 200 has a vertical orientation, and current can flow along the (111) surface of the crystalline structure 200 in a VTFET, as illustrated by "arrow A."

Although the current is shown flowing from the bottom of the crystalline structure 200 to the top of the crystalline structure 200, the current could flow in the opposite direction. For example, the orientation of the source/drain regions of a VTFET having channel surfaces including crystalline Ge having the crystalline structure 200 can dictate the direction of current flow between the source/drain regions.

Figure 12:
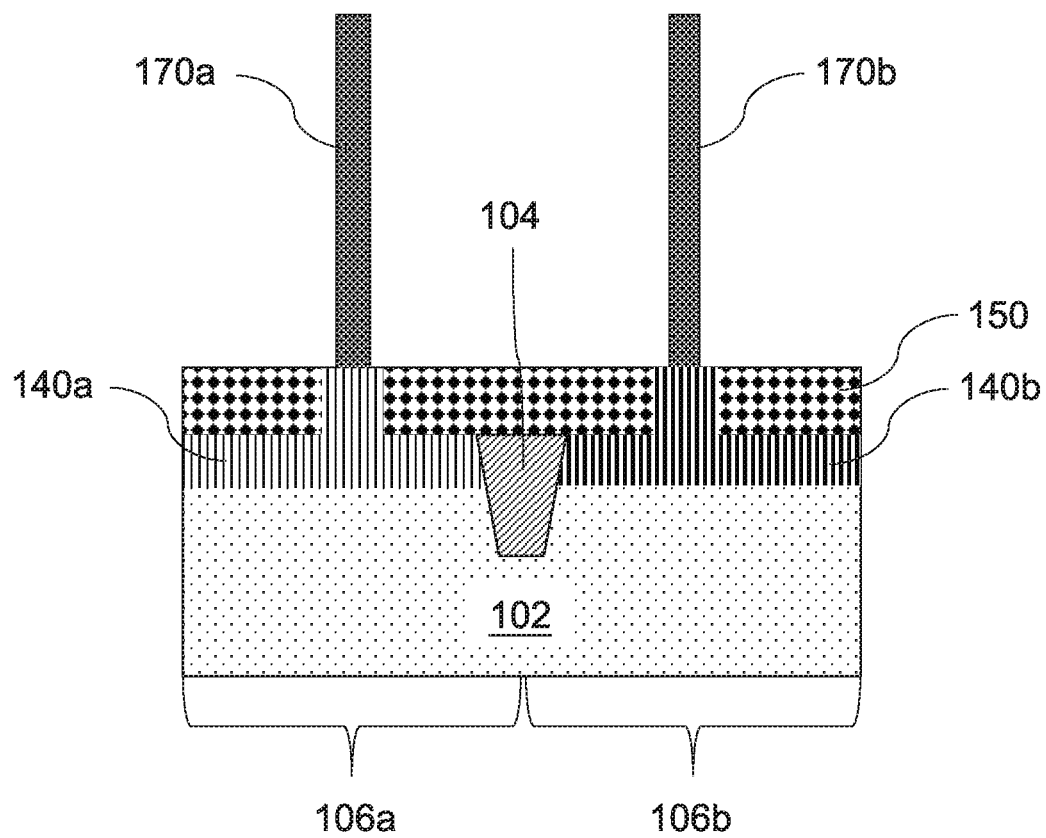
FIG. 12 is a cross-sectional view showing the removal of material during the fabrication of the semiconductor device, in accordance with an embodiment of the present invention.

Referring to FIG. 12, after the desired concentration of Ge is achieved, the liner 160 and the cap layers 112*a* and 112*b* are removed. Any suitable process for removing the liner 160 and the cap layers 112*a* and 112*b* can be employed in accordance with the embodiments described herein. Further downstream processing steps can then be performed on the device 100.

Figure 13:
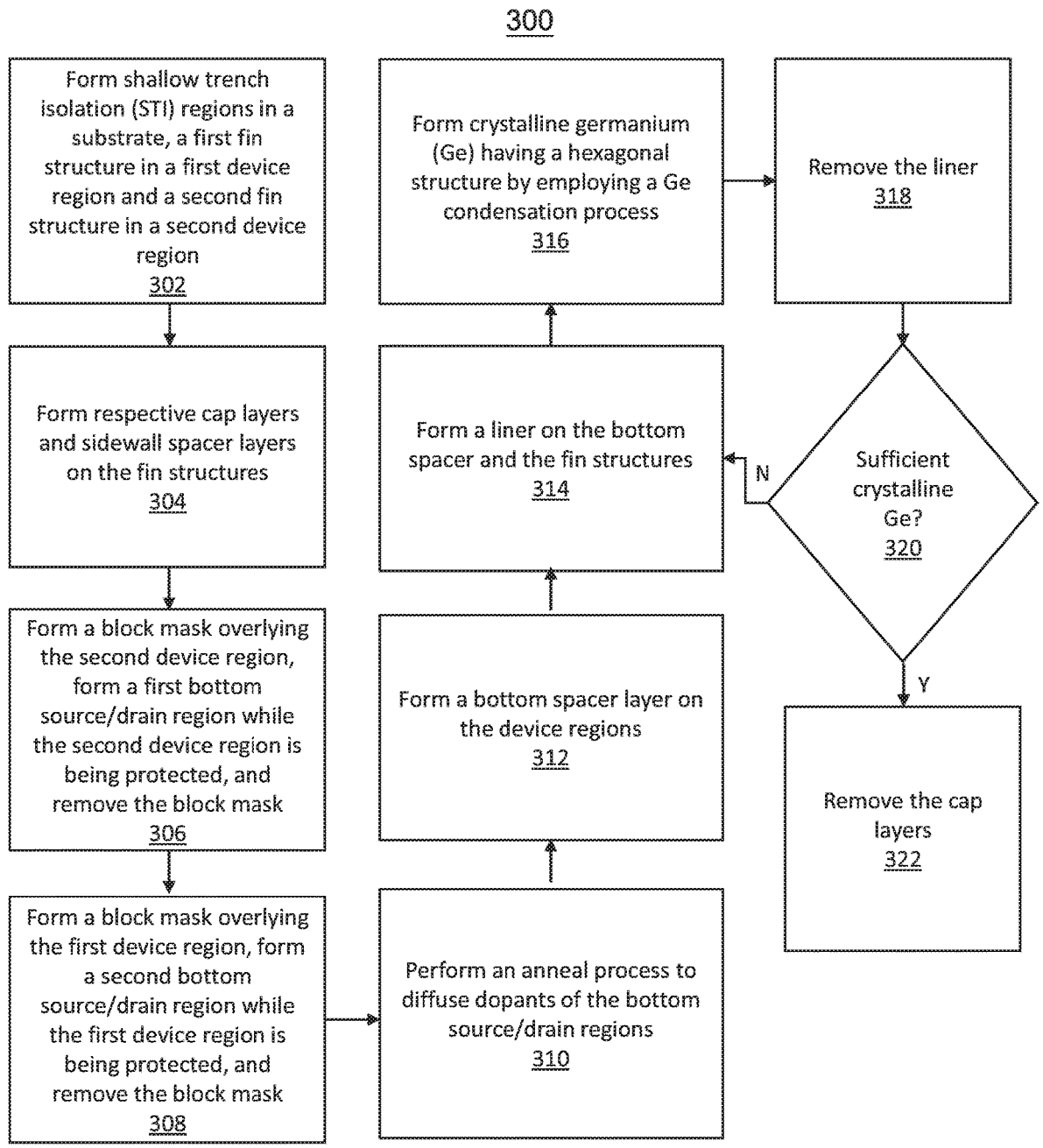
FIG. 13 is a block/flow diagram showing a system/ method for fabricating a semiconductor device, in accordance with an embodiment of the present invention.

With reference to FIG. 13, a block/flow diagram 300 is provided illustrating a process for fabricating a semiconductor device.

At block 302, one or more shallow trench isolation (STI) regions are formed to provide isolation between a first device region and a second device region, a first fin structure is formed in the first device region and a second fin structure is performed in a second device region. In one embodiment, the first and second device regions are associated with respective VTFETs.

The one or more STI regions can formed by etching one or more trenches in a substrate utilizing an etch process such as RIE or plasma etching, although those examples should not be considered limiting. The one or more trenches can optionally be lined with a liner material, e.g., an oxide, and then CVD or another like deposition process can be used to fill the trench with polysilicon or another like STI dielectric material. The STI dielectric material may optionally be densified after deposition. A planarization process such as chemical-mechanical polishing (CMP) can be used to provide a planar structure.

The first and second fin structures can include a semiconductor material that includes germanium (Ge) within the first and second regions. In one embodiment, forming the first and second fin structures at block 302 includes epitaxially growing a film of the semiconductor material, and removing a portion of epitaxially grown semiconductor material film to create the fin structures. For example, a reactive-ion etch (RIE) process can be employed to remove the epitaxially grown semiconductor material film.

In one embodiment, the semiconductor material that includes Ge includes SiGe. The epitaxial growth process of the SiGe film can be done at the very beginning of device fabrication process utilizing any process suitable for use in accordance with the embodiments described herein, such as by blanket epitaxial growth of the SiGe film. In an embodiment where a substrate of the device includes Si, an atomic lattice mismatch between the SiGe film and the Si is introduced. Thus, to avoid crystalline defect generation during the fabrication of the device, the SiGe film should have a sufficiently low atomic percentage of Ge relative to the atomic percentage of Si (e.g., a low Ge content SiGe). Otherwise, crystalline defects can be formed in the SiGe film, which can limit the performance of the device, as well as yield additional issues associated with the device.

The initial atomic percentage of Ge included in the SiGe film can be determined in accordance with the epitaxial growth process. For example, the SiGe film can have an initial atomic percentage of Ge less or equal to about 40% (e.g., SiGe 40%), such that the initial atomic percentage of Si included in the SiGe film is greater than or equal to about 60%. In one embodiment, the initial atomic percentage of Ge in the SiGe film is less than or equal to about 25% (e.g., SiGe 25%), such that the initial atomic percentage of Si included in the SiGe film is greater than or equal to about 75%. In one embodiment, the initial atomic percentage of Ge in the SiGe film is less than or equal to about 20% (e.g., SiGe 20%), such that the initial atomic percentage of Si included in the SiGe film is greater than or equal to about 80%. The initial atomic percentage of Ge included in the SiGe film can be tightly controlled below 0.5% during the epitaxial process.

At block 304, respective cap layers and sidewall spacer layers are formed on the fin structures.

The cap layers can include a dielectric material, such as a nitride, oxide, oxynitride material, and/or any other suitable dielectric material. The cap layers can include a single layer of dielectric material or multiple layers of dielectric materials. The cap layers can be formed by a deposition process, such as chemical vapor deposition and/or atomic layer deposition. Alternatively, the cap layers can be formed using a growth process, such as thermal oxidation or thermal nitridation.

The sidewall spacer layers can be formed by conformally depositing spacer layer material, and performing an etch process (e.g., RIE) to remove the excess spacer material. The spacer material of the sidewall spacer layers can include any suitable dielectric material in accordance with the embodiments described herein, such as silicon oxide, silicon nitride, boron nitride, silicon carbon, etc. In one embodiment, the sidewall spacer layers include a low-k dielectric material. The term "low-k dielectric" generally refers to a dielectric material having a dielectric constant less than silicon dioxide ($SiO_2$) (e.g., less than 3.9). Examples of low-k dielectric materials include, but are not limited to, dielectric nitrides (e.g., silicon nitride, SiBCN) and dielectric oxynitrides (e.g., SiOCN).

At block 306, a block mask is formed overlying the second device region, and a first bottom source/drain region is formed within the first device region while the second device region is being protected by the block mask. The block mask may include soft and/or hard mask materials formed using any processes suitable for use in accordance with the embodiments described herein. In one embodiment, the block mask includes any suitable dielectric material that has an etch selectivity over the cap layers and the sidewall spacer layers, in accordance with the embodiments described herein. The formation of the first bottom source/drain region can be performed, for example, via epitaxial growth and/or ion implantation to provide for a first type of semiconductor device. In one embodiment, the first type of semiconductor device is an n-type semiconductor device. Thereafter, the block mask is removed using any suitable removal process.

At block 308, a block mask is formed overlying the first device region, and a second bottom source/drain region is formed within the second device region while the first device region is being protected by the block mask. In one embodiment, the block mask includes any suitable dielectric material that has an etch selectivity over the cap layers and the sidewall spacer layers, in accordance with the embodiments described herein. The formation of the second bottom source/drain region can be performed, for example, via epitaxial growth and/or ion implantation to provide for a second type of semiconductor device. In one embodiment, the second type of semiconductor device is a p-type semiconductor device. Thereafter, the block mask is removed using any suitable removal process.

At block 310, an anneal process is performed to diffuse dopants of the bottom source/drain regions. In one embodiment, the anneal process include a junction anneal process. Any anneal process to diffuse the dopants of the bottom source/drain regions can be employed in accordance with the embodiments described herein.

At block 312, a bottom spacer layer is formed on the device regions. The bottom spacer layer can be formed by any suitable process (e.g., plasma vapor deposition), and can include any suitable dielectric material in accordance with the embodiments described herein. For example, the bottom spacer layer can include $SiO_2$. In one embodiment, the bottom spacer layer includes a low-k dielectric material. Examples of low-k dielectric materials include, but are not limited to, dielectric nitrides (e.g., silicon nitride, SiBCN) and dielectric oxynitrides (e.g., SiOCN).

At block 314, a liner is formed on the bottom spacer and the fin structures to protect the fin structures during Ge condensation and to prevent diffusion of the Ge from the fin structures. In one embodiment, the liner is formed by conformal deposition. The liner formed at block 314 can include any suitable material in accordance with the embodiments described herein.

At block 316, crystalline Ge having a hexagonal structure is formed by employing a Ge condensation process. The Ge condensation process performed at block 316 can include a 3D Ge condensation process. The 3D Ge condensation process can be induced by thermal oxidation. For example, the 3D Ge condensation process can be induced in an oxygen gas ($O_2$) environment from about 600 degrees Celsius to about 800 degrees Celsius.

At block 318, the liner is removed using any suitable process in accordance with the embodiments described herein.

As described above, multiple cycles of the Ge condensation process can be performed in order to achieve a sufficient high concentration of crystalline Ge.

At block 320, it is determined if there is a sufficiently high concentration of crystalline Ge formed resulting from the process at block 316. If not, another liner is formed at block 314, and a subsequent cycle of the Ge condensation process is performed at block 316. In one embodiment, due to the increase in the percentage of Ge after the performance of the preceding cycle of the Ge condensation process, the temperature associated with the subsequent cycle of the Ge condensation process is less than the temperature associated with the preceding cycle of the Ge condensation process.

At block 322, if it is determined that there is a sufficiently high concentration of Ge, the cap layers are removed using any suitable process in accordance with the embodiments described herein. Further downstream processing steps can then be performed on the device.

Having described preferred embodiments of a semiconductor device and a method of fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device including vertical transport fin field-effect transistors (VT-FETs), comprising:
    forming a bottom spacer on a first bottom source/drain region of a first VTFET associated with a first device region, on an isolation region, and on a second bottom source/drain region of a second VTFET associated with a second device region;
    conformally forming a liner over the bottom spacer, a first fin structure within the first device region and a second fin structure within the second device region, the first and second fin structures each including a fin having a single silicon germanium (SiGe) layer formed from a silicon (Si) surface having a (110) orientation; and
    forming crystalline Ge having a hexagonal structure from the SiGe by employing a Ge condensation process under the liner to orient a (111) direction of the crystalline Ge in a vertical direction of charge flow for the first and second VTFETs.

2. The method of claim 1, wherein the Ge condensation process includes one or more cycles of a three-dimensional (3D) Ge condensation process.

3. The method of claim 2, wherein the one or more cycles of the 3D Ge condensation process are induced by thermal oxidation.

4. The method of claim 3, wherein the one or more cycles of the Ge condensation are induced by thermal oxidation in an oxygen gas ($O_2$) environment at a temperature from about 600 degrees Celsius to about 800 degrees Celsius.

5. The method of claim 1, further comprising forming a first sidewall spacer layer on the first fin structure and a second sidewall spacer layer on the second fin structure.

6. The method of claim 5, further comprising forming the first bottom source/drain region from a substrate within the first device region, and the second bottom source/drain region from the substrate within the second device region.

7. The method of claim 6, further comprising performing an anneal process to diffuse dopants from the first and second bottom source/drain regions.

8. The method of claim 1, further comprising forming the first and second fin structures, including epitaxially growing each fin based on a SiGe film having an initial atomic percentage of Ge less than about 25%.

9. The method of claim 8, wherein the initial atomic percentage of Ge is less than or equal to about 20%.

10. The method of claim 1, wherein the liner includes silicon dioxide ($SiO_2$).

11. The method of claim 1, wherein the first VTFET is an VTFET and the second VTFET is a pFET.

12. The method of claim 1, further comprising forming the first and second fin structures, including epitaxially growing each fin based on a SiGe film having an initial atomic percentage of Ge less than or equal to about 40%.

13. A method for fabricating a semiconductor device including vertical transport fin field-effect transistors (VTFETs), comprising:
- forming a first fin structure in a first device region associated with a first VTFET and a second fin structure a second device region associated with a second VTFET, the first and second fin structures each including a fin having a single silicon germanium (SiGe) layer formed from a silicon (Si) surface having a (110) orientation;
- forming a first sidewall spacer layer on the first fin structure and a second sidewall spacer layer on the second fin structure;
- forming a first bottom source/drain region from a substrate within the first device region, and a second bottom source/drain region from the substrate within the second device region;
- performing an anneal process to diffuse dopants of the first and second bottom source/drain regions;
- forming a bottom spacer on the first bottom source/drain region, on an isolation region, and the second bottom source/drain region;
- conformally forming a liner over the bottom spacer and the first and second fin structures; and
- forming crystalline Ge having a hexagonal structure from the SiGe by employing a Ge condensation process under the liner to orient a (111) direction of the crystalline Ge in a direction of charge flow for the first and second VTFETs.

14. The method of claim 13, wherein the Ge condensation process includes one or more cycles of a three-dimensional (3D) Ge condensation process.

15. The method of claim 14, wherein the one or more cycles of the 3D Ge condensation are induced by thermal oxidation in an oxygen gas ($O_2$) environment at a temperature from about 600 degrees Celsius to about 800 degrees Celsius.

16. The method of claim 13, wherein forming the first and second fin structures further includes epitaxially growing each fin based on a SiGe film having an initial atomic percentage of Ge less than about 25%.

17. The method of claim 16, wherein the initial atomic percentage of Ge is less than or equal to about 20%.

18. The method of claim 13, further comprising removing the liner from the bottom spacer and the first and second fin structures.

19. The method of claim 13, wherein the first VTFET is an nFET and the second VTFET is a pFET.

20. The method of claim 13, wherein forming the first and second fin structures further includes epitaxially growing each fin from a SiGe film having an initial atomic percentage of Ge less than or equal to about 40%.

* * * * *